May 21, 1963 E. E. CADO 3,090,706

PRINTED CIRCUIT PROCESS

Original Filed Sept. 19, 1955

INVENTOR.
Erwin E. Cado
BY
Mueller & Aichele
Attys.

United States Patent Office 3,090,706

Patented May 21, 1963

3,090,706

PRINTED CIRCUIT PROCESS

Erwin E. Cado, Northbrook, Ill., assignor to Motorola, Inc., Chicago, Ill., a corporation of Illinois Continuation of application Ser. No. 535,143, Sept. 19, 1955. This application July 3, 1959, Ser. No. 825,390

4 Claims. (Cl. 117—212)

This invention relates to printed circuit processes and products, and more particularly to an improved printed circuit process and product whereby metallic conductors are firmly retained on an insulating panel with electrical leakage therebetween being reduced to a minimum and which circuit is especially adapted for dip soldering operation.

This application is a continuation of application Serial No. 535,143, filed September 19, 1955, now abandoned.

The use of printed circuits in the electronic industry has become widespread in recent years due to the economies that can be realized thereby, both in direct labor and in reduced overhead. However, the provision of a printed or plated circuit assembly that is suited for general use in the electronic art has proved to be more difficult than was originally supposed.

One problem in the printed circuit art that has arisen is that of providing firm adhesion between the metallic conductor of the printed circuit assembly and the insulating supporting panel. Generally, the insulating panel is composed of a phenol condensation product such as "Bakelite," and the surface of the panel is usually glossy with low adhesive properties. It has been proposed to roughen the surface of such a panel by mechanical means such as sand-blasting, but this usually is at the expense of the electrical insulating characteristics of the surface. This loss in insulating characteristics arises because of the fact that when the panel surface loses its high gloss it becomes subject to moisture absorption with resulting electrical leakage between the metallic conductor of the printed circuit. This is not too serious in applications where "hot" discharge devices are used, because such devices keep the panel surface heated and in a relatively dry condition. However, when assemblies of this type are used in car radios and the like, or with transistors, or in other apparatus where little heat is generated, the moisture absorption property of the panel surface with the resulting electrical leakage problem can become serious.

Another approach to the problem of providing a rigid adhesion between the metallic conductors and the insulating panel is to apply an adhesive layer or film to the surface of the panel. This expedient, however, creates troubles of its own. First, an adhesive has to be found which exhibits high adhesion to both the panel surface and the metallic conductors if it is to be at all effective. Not only must the adhesive answer these requirements, but it must be such that it does not exhibit any appreciable moisture absorption tendencies since that could lead to electrical leakage. Moreover, the adhesive must have no tendency to produce solder bridging between adjacent ones of the metallic conductors during subsequent soldering operations.

Another problem that has proved troublesome in the development of the printed circuit art is that of soldering. A prime function of the printed circuit is to permit rapid and essentially automatic soldering. Most manufacturing processes today use dip soldering or variations thereof in conjunction with printed circuit panel assemblies. When a prior art printed circuit assembly is dip soldered, the solder covers and adheres to all exposed metal parts including the metallic conductor of the printed circuit assembly. This gives all the conductors a coating of solder which is not only wasteful of solder, but has a tendency to produce bridging and resulting short circuits between closely adjacent conductors.

It is, accordingly, a general object of the present invention to provide an improved process and printed circuit assembly in which the drawbacks and disadvantages inherent in prior art processes as discussed above are successfully overcome.

Another object of the present invention is to provide such an improved process in which treatment of the surface of the insulating panel of a printed circuit assembly, such as by roughening or the application of an adhesive, to increase adhesion may be dispensed with, and yet in which sufficient adhesion between the metallic conductors and the panel is provided; or, alternately, a process whereby the expedients of surface treatment discussed previously herein can be used to provide superior adhesion without degrading the electrical insulation characteristics of the panel surface.

Another object of the invention is to provide such an improved process whereby the resulting printed circuit panel assembly may be dip soldered, with such dip soldering resulting in solder adhering only to localized points and areas of the metallic conductors to which it is desired that solder connections and joints be made.

Yet another object of the invention is to provide an improved printed circuit assembly in which the metallic conductors comprising the electric circuit are firmly and rigidly supported on the surface of the insulating panel, which surface exhibits high water repellent characteristics so that electrical leakage is reduced to a minimum even under the most adverse conditions, and which assembly may be dip soldered without solder adhering to any part of the metallic conductors except those portions at which it is desired to make soldering contact.

The features of the invention which are believed to be new are set forth with particularity in the appended claims. The invention itself, however, together with further objects and advantages thereof, may be best understood by reference to the following description when taken in conjunction with the accompanying drawing in which:

The present invention will be described with respect to a printed circuit assembly in which metallic conductors are formed on one side only of the insulating base. However, as described in Nieter Patent, 2,699,425—January 11, 1955, it is more convienient to form the circuit on both sides of the panel with plated interconnection extending through apertures in the panel. It is to be understood that the present invention applies equally to assemblies with circuits on both sides of the panel and that this requires merely a duplication of the process which is now to be described.

The invention provides a process for coating a printed circuit assembly which includes an insulating base having metallic conductors formed on at least one surface thereof, which process comprises selectively applying a coating over the surface of the panel and over portions of the metallic conductors to encase and retain the conductors on that surface and reduce electrical leakage therebetween, with the portions of the conductors other than those covered by the coating being available for subsequent soldering operations, and thereafter curing the coating to form a hard electrically and thermally insulating adhesive layer that is impervious to molten solder.

The invention also provides a printed circuit assembly which comprises an insulating base with metallic conductors formed on at least one surface thereof, and an electrically and thermally insulating adhesive coating impervious to molten solder encasing the surface of the panel and extending over portions of the metallic conductors to retain the same on the surface and reduce electrical leakage therebetween, with the portions of the conductors other than those covered by the coating being available for subsequent soldering operations.

Figure 1:
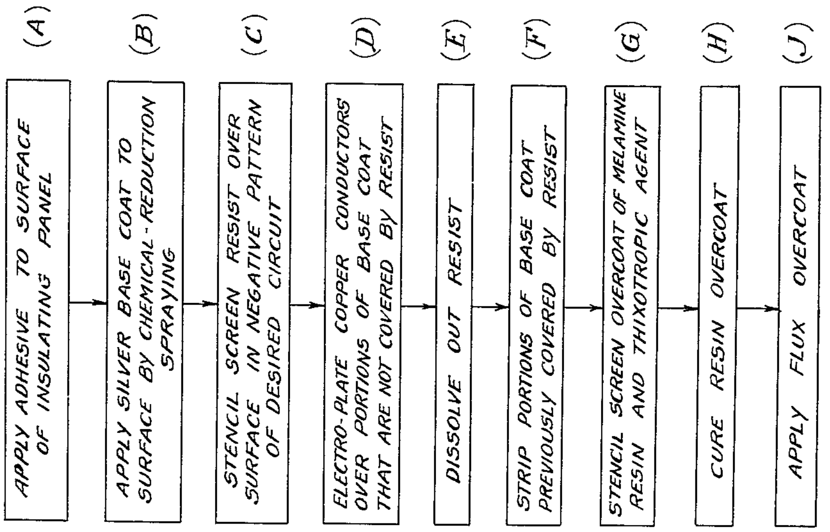
FIG. 1 shows one specific example of the process of the invention.

A specific example of one embodiment of the process of the invention is shown in FIG. 1. In accordance with this embodiment, an insulating panel formed, for example, of a phenol condensation product such as "Bakelite" has an adhesive layer formed on at least one surface thereof effectively to treat that surface and improve its adhesive properties insofar as metallic conductors are concerned (Step "A"). An adhesive that has been used with a high degree of satisfaction is sold under the designation 220–249, this being a thermosetting phenolic resin with a Hy-Car rubber base such as an acrylonitrile-butadiene or buna synthetic rubber. This adhesive may be applied to the panel by rolling, spraying or dipping. This adhesive dries almost immediately so that no further cure step is needed.

A silver base coat is then applied to form a continuous film over the entire surface of the panel (Step "B"). This base coat may be formed in the manner described in the Nieter patent referred to previously herein. That is, a sensitizing solution in the form of stannous chloride ($SnCl_2$) is sprayed onto the adhesive layer, and the assembly is then washed with a water spray to reduce the sensitizer to a trace. The assembly is then subjected to a dual spray of a silver salt solution and a salt reducing solution which causes metallic silver to be deposited on the adhesive layer to form the silver base coat. After the silver base coat has been formed, a suitable resist that is proof against electrolytic action is stencil screened in a negative pattern of the desired circuit over the base coat (Step "C"). Highly plasticized screening lacquer such as referred to in the Nieter patent may be used for this resist.

Copper conductors are then electroplated (Step "D") over portions of the base coat that are not covered by the resist, and this may be achieved in the manner also described in the Nieter patent by placing the assembly in a suitable copper electroplating bath. The resist is now dissolved out, and this may be done by a solvent spray or dip containing caustic soda when the lacquer resist is used. (Step "E.")

It is now necessary to remove the portions of the metallic base coat that were previously covered by the resist since they constitute a short circuit for the various metallic conductors of the printed circuits. This is indicated by Step "F," and this selective stripping of the base coat may be carried out by treating the base with a solution of nitric acid, phosphoric acid, acetic acid, and hydrochloric acid. This solution not only removes the desired portions of the silver base coat, but also functions to clean the copper conductors. A stencil screen is now laid over the assembly (Step "G"), and this screen blocks those portions of the copper conductors to which solder connections are to be subsequently made. A resin overcoat is forced through the stencil screen by any suitable means such as squee-gee action. This resin overcoat is an adhesive coating which covers the surface of the panel and extends over the portions of the metallic conductors other than those blocked by the stencil screen so as to retain these conductors on the surface of the panel and reduce electrical leakage therebetween, with the portions of the conductors blocked by the stencil screen being uncovered and available for subsequent soldering operations. This resin overcoat may advantageously be a melamine base resin such as one known in the trade as "Resimene No. 875." This resin is of the aminotriazine family of nitrogen compounds. It is essentially a butylated melamine formaldehyde resin in a solvent. The melamine resin inherently forms films with excellent heat resistance and heat insulation properties such that when the selectively coated panel is dipped in molten solder, the coating keeps the solder and much of its heat away from the underlying conductors and panel. The resin is mixed with a thixotropic agent to give it body, i.e., a "Vaseline"-like consistency. That is, the resin is given a consistency such that it passes through the stencil screen easily but has no tendency to "run" after stencilling but holds to the desired stencil design. The thixotropic agent also has the inherent property of greatly enhancing the heat insulating characteristics of the coating. Thus, even resin materials with lower heat resistance than melamine are improved by the thixotropic agent to the point where satisfactory results are obtained. Advantageous thixotropic agents such as a colloidal silica or silica aerogel of pure blown silica powder are available commercially under the trademarks "Cabosil" and "Santocel," and the "Cabosil" is preferred.

When the resin overcoat has been formed, the stencil screen is removed and the assembly is cured in a convection oven at about 225° F. for around 60 minutes to assure complete cure of the coating. This causes the coating (Step "H") to harden and form a hard electrically and thermally insulating adhesive layer that is impervious to molten solder and which, as previously noted, firmly retains the conductors on the panel and reduces electrical leakage therebetween.

The coating described above covers the entire surface of the printed circuit assembly, except those portions to which it is desired that subsequent soldering operations be made. The entire assembly is then dipped in a rosin solution to form a flux overcoat (Step "J"). This overcoat process is fully described in abandoned application Serial No. 526,573 of Donald P. Foudriat which was filed August 4, 1955, and which is assigned to the present assignee as well as in the copending continuation-in-part application thereof Serial No. 658,463, filed May 10, 1957, now U.S. Patent No. 3,034,930. As fully described in that application, the flux overcoat preferably contains a low melting point rosin, a high melting point thermoplastic dimeric resin, and a suitable plasticizer. This composition provides a film over the entire unit which further protects the assembly and enables soldering connections to be made to the portions of the circuit left uncovered by the resin overcoat without the need of any further fluxing action.

Figure 2:
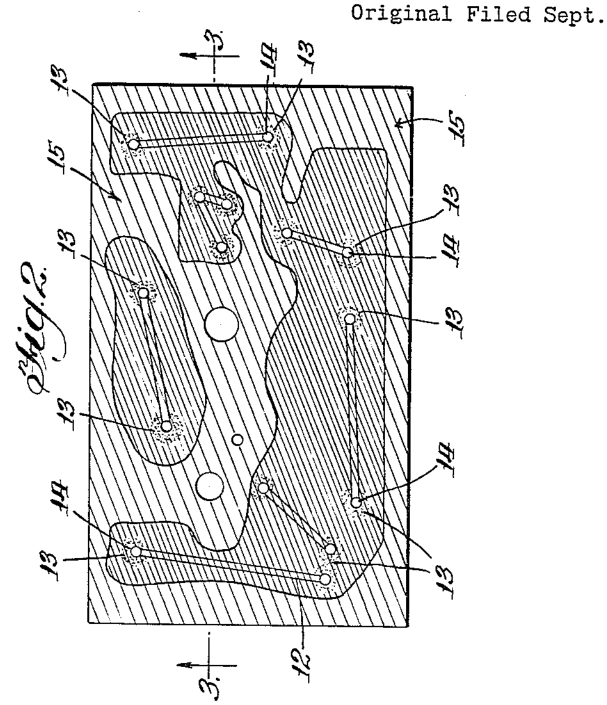
FIG. 2 is a printed circuit panel assembly constructed in accordance with the invention.
Figure 3:
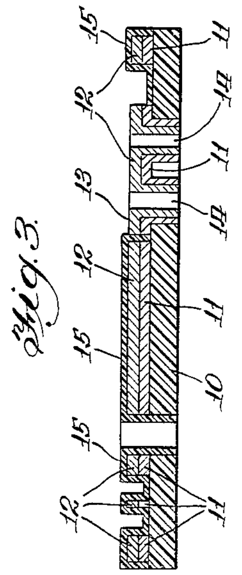
FIG. 3 is a section taken along the line 3—3 of FIG. 2.

A printed circuit assembly constructed, for example, in accordance with the process of FIG. 1, is shown in FIGS. 2 and 3. This assembly includes an insulating panel 10 having a base coat 11 formed thereon which may, for example, be of silver. The electric conductors 12 formed, for example, of copper are plated over the base coat to form a desired circuit configuration. Various points on the electric circuit such as the portions indicated as 13 are intended to receive subsequent circuit connections, and these portions may include plated eyelets 14 which consists of carrying the copper conductors through apertures in the panel in a manner fully described in the aforementioned Nieter patent. The resin overcoat 15 is selectively applied to the panel assembly so that it does not extend over the portions 13, leaving these portions free to receive subsequent soldering. Yet the resin overcoat 15 covers the major portion of the electrical metallic conductor so that these conductors are firmly maintained on the insulating panel by an adhesive, solder impervious coating.

Step "A" of FIG. 1 describes treating the surface of the panel by applying an adhesive layer thereto. Of course, this surface may be treated in other ways to deglaze the surface and increase its adhesion characteristics. However, it should be pointed out at this point, that satisfactory panels have been constructed without any surface treatment to the insulating panel and with the overcoat 15 alone functioning to retain the conductors of printed circuit firmly on the insulating panel. However, deglazing of the surface or other treatment to increase its adhesive properties further assures that the circuits will be rigidly and firmly retained on the insulating panel. Other methods of deglazing the surface of the panel comprising brushing with a wire brush, using a roughened platen which is pressed against the surface, sand-blasting, etc., may be used. It should be noted that even though some of these techniques and methods of surface deglazing may tend to decrease the electrical insulating properties of the surface to some extent, due to the fact that overcoat 15 extends over and between the various conductors, a sheath of high electrical insulation and low leakage is assured by the layer 15 even though the surface of the panel itself may have lost its insulating properties to some extent.

Steps "B–F" of FIG. 1 refer to one type of process whereby the conductors are plated onto the insulating panel. However, other known methods can be used for forming the electric circuit on the panel; such as photosensitive resist methods, the well-known etched-foil process, or others of a similar nature.

Where a metallic base coat is used, there is, of course, no need to limit this to silver. For example, the technique explained in copending application Serial No. 538,906, filed October 6, 1955, in the name of Donald W. Swanson, may be used which provides a copper base coat on the insulating panel which later receives the copper conductors.

The overcoat of Step "G" has been stated as being applied by stencil screen. Although this represents a convenient manner for the application of this overcoat, it can also be applied by, for example, by spraying, offset printing, or by other known means whereby a selective resin overcoat may be formed in a predetermined design on the printed circuit assembly.

Although the particular melamine resin described previously herein has been used to advantage, many other resins are suitable for this purpose and some other resin materials can be used together with the melamine resin. For example, successful assemblies have been formed by using the following substances as the overcoat:

- Polyester resin of the triallyl cyanurate type available as "Mx179" and "Laminac" No. 4232
- Polyester resin of the triallyl cyanurate type plus antimony trioxide (fire retarding), available as "Laminac" No. 4233
- Polyvinyl acetates
- Thermoplastic resins
- Melamine, phenolic and silicone combinations
- Epoxies
- Melamine plus alkyl resins
- Melamine plus urea formaldehyde resin
- Melamine plus polyvinyl butyrals Finally, the cure of the resin overcoat can be an air cure at room temperature. However, for speeding up the process, it is preferable to cure it at elevated temperatures. A convection oven can be used which requires about 60 minutes at 220° F. When infra-red methods are used, the time can be speeded up to about 12 minutes. In any event, there are no fixed times or temperatures to the cure, the purpose being merely to dry and set the resin.

Successful assemblies have also been made by applying the flux overcoat of Step "J" of FIG. 1 prior to the resin overcoat of Step "G," with the flux overcoat being applied selectively only to portions of the assembly where subsequent soldering is to be made. When this flux coat has the composition of the aforementioned Foudriat application, it inhibits the formation of the resin overcoat thereon, so that the assembly may be dipped in a bath of the resin overcoat and the latter forms only over those portions of the assembly that are not covered by the flux coat to provide the same configuration as previously.

The invention provides, therefore, an improved product and process whereby a hard, rigid, resin overcoat is selectively formed over a printed circuit assembly rigidly to hold the metallic conductors upon the insulating surface of the insulating base, with the coating being impervious to molten solder and forming an electrically and thermally insulating medium over and between the various conductors. The use of this coating assures that the metallic conductors will be firmly retained on the insulating base without excessive treatment of the surface of that base, and also assures that subsequent dip soldering operations will produce solder only where wanted and not on all the metallic conductors.

I claim:

1. In a printed circuit assembly adapted for a soldering operation in which a face of the assembly is substantially entirely contacted with molten solder, said assembly including a relatively permanent insulating base and which has metallic wiring conductors applied on at least one surface of the base, the improvement comprising a patterned overcoat of melamine resin base material including a thixotropic agent extending over at least said one surface of the panel and over selected portions of the metallic conductors, said patterned overcoat being a hard adhesive layer which aids in retaining the conductors on said surface, and said melamine resin and said thixotropic agent giving said layer high thermal and electrical insulating characteristics to protect the assembly from heat and thus prevent loosening of said conductors by heat and to prevent undue electrical leakage between said conductors.

2. In a printed circuit assembly adapted for a soldering operation in which a face of the assembly is substantially entirely contacted with molten solder, said assembly including a relatively permanent insulating base and which has metallic wiring conductors applied on at least one surface of the base, the improvement comprising a patterned overcoat of melamine resin base material including a thixotropic agent and an alkyd resin extending over at least said one surface of the panel and over selected portions of the metallic conductors, said patterned overcoat being a hard adhesive layer which aids in retaining the conductors on said surface, and said melamine resin and said thixotropic agent and alkyd resin giving said layer high thermal and electrical insulating characteristics to protect the assembly from heat and thus prevent loosening of said conductors by heat and to prevent undue electrical leakage between said conductors.

3. In a method of preparing a printed circuit assembly for a soldering operation in which a face of the assembly is substantially entirely contacted with molten solder, which assembly includes a relatively permanent insulating panel with metallic wiring conductors applied on at least one surface thereof, the improvement comprising the steps of stencil screening a melamine resin base material on at least one surface of said insulating panel and over selected major portions of the metallic conductors thereon, with portions of said conductors other than said selected portions being available for contact with molten solder in a subsequent soldering operation, said melamine resin base material including a thixotropic agent serving to increase the heat insulating characteristics of said coating and thickening said material to a desired consistency for said stencil screening, and thereafter curing said coating to form a hard non-brittle layer that is resistant to molten solder and to the heat thereof during said subsequent soldering operation and which aids in retention of said conductors on said insulating panel thereafter.

4. In a method of preparing a printed circuit assembly for a soldering operation in which a face of the assembly is substantially entirely contacted with molten solder, which assembly includes a relatively permanent insulating panel with metallic wiring conductors applied on at least one surface thereof, the improvement comprising the steps of stencil screening a melamine resin base material on at least one surface of said insulating panel and over selected major portions of the metallic conductors thereon, with portions of said conductors other than said selected portions being available for contact with molten solder in a subsequent soldering operation, said resin base material including melamine resin and alkyd resin serving as heat resistant film-forming material that is electrically insulating, and a thixotropic agent serving to thicken said resin base material to a proper consistency for said stencil screening and providing increased heat insulation, and thereafter curing said coating to form a hard non-brittle layer that is resistant to molten solder and to the heat thereof during said subsequent soldering operation and which aids in retention of said conductors on said insulating panel thereafter.

References Cited in the file of this patent

UNITED STATES PATENTS

| | | |
|---|---|---|
| 2,695,351 | Beck | Nov. 23, 1954 |
| 2,740,193 | Pessel | Apr. 3, 1956 |
| 2,777,192 | Albright et al. | Jan. 15, 1957 |
| 2,874,085 | Brietzke | Feb. 17, 1959 |
| 2,988,839 | Greenman | June 20, 1961 |

FOREIGN PATENTS

| | | |
|---|---|---|
| 1,023,101 | Germany | Jan. 23, 1958 |

OTHER REFERENCES

Gordon et al.: "Surface Coatings and Finishes" (1954), Chem. Pub. Com., New York, N.Y. Page 97.

National Bureau of Standards "Printed Circuit Techniques," Circular No. 468, November 15, 1947. (Page 20 relied on.)